United States Patent
Matsunami (10) Patent No.: US 7,132,314 B2
(45) Date of Patent: Nov. 7, 2006

(54) SYSTEM AND METHOD FOR FORMING ONE OR MORE INTEGRATED CIRCUIT PACKAGES USING A FLEXIBLE LEADFRAME STRUCTURE

(75) Inventor: Akira Matsunami, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 54 days.

(21) Appl. No.: 10/856,296

(22) Filed: May 28, 2004

(65) Prior Publication Data
US 2005/0263862 A1  Dec. 1, 2005

(51) Int. Cl.
*H01L 21/44* (2006.01)
*H01L 21/48* (2006.01)
*H01L 21/50* (2006.01)
*H01L 23/495* (2006.01)
*H01L 23/48* (2006.01)
*H01L 23/52* (2006.01)
*H01L 23/40* (2006.01)

(52) U.S. Cl. ............. 438/123; 257/666; 257/735

(58) Field of Classification Search ........... 438/123; 257/666, 667, 692, 693, 735
See application file for complete search history.

(56) References Cited

U.S. PATENT DOCUMENTS

| | | | |
|---|---|---|---|
| 2002/0024121 A1* | 2/2002 | Matumoto | 257/666 |
| 2005/0098859 A1* | 5/2005 | Hasegawa | 257/666 |
| 2005/0258520 A1* | 11/2005 | Dolan | 257/670 |

* cited by examiner

*Primary Examiner*—Carl Whitehead, Jr.
*Assistant Examiner*—Heather Doty
(74) *Attorney, Agent, or Firm*—Yingsheng Tung; Wade James Brady, III; Frederick J. Telecky, Jr.

(57) ABSTRACT

In certain embodiments, a leadframe structure for forming one or more integrated circuit packages includes a number of adjacent substantially parallel lead bars adapted to receive a die associated with an integrated circuit at one or more of the lead bars such that the one or more lead bars extend from opposite sides of the die. The leadframe structure also includes one or more support structures (e.g. lead support bars 26) adapted to help hold the lead bars together.

8 Claims, 4 Drawing Sheets

SYSTEM AND METHOD FOR FORMING ONE OR MORE INTEGRATED CIRCUIT PACKAGES USING A FLEXIBLE LEADFRAME STRUCTURE

TECHNICAL FIELD OF THE INVENTION

This invention relates generally to integrated circuits and more particularly to a system and method for forming one or more integrated circuit packages using a flexible leadframe structure.

BACKGROUND

Certain types of integrated circuit packages are typically formed using a leadframe structure, during a package assembly process for example. Normally, a leadframe structure includes a stamped or etched metal frame that includes a die-mounting position (e.g., a die-mounting paddle or die flag) and a predetermined number of lead fingers for providing electrical connections to devices or components external to an integrated circuit package formed using the leadframe. A die associated with an integrated circuit chip may be attached to the die-mounting position and one or more bond pads of the die may be attached to corresponding lead fingers of the leadframe, using conductive connectors (e.g., gold or other conductive wires) for example, to provide electrical connections for a packaged electrical device.

A different leadframe structure is generally designed for each type of integrated circuit package based, for example, on the number of pins desired for each integrated circuit package and/or the size of the die of each integrated circuit package. For example, integrated circuit packages having eight pins may require a first type of leadframe structure, integrated circuit packages having ten pins may require a second type of leadframe structure, and so on. Different leadframe tools may be needed for making each of these types of leadframe structures and the integrated circuit packages made using each different type of leadframe structure, which may increase costs and be otherwise burdensome. Furthermore, different documentation necessary or useful for building and connecting to each of these types of leadframe structure may also be needed.

SUMMARY OF THE INVENTION

According to the present invention, certain disadvantages and problems associated with previous techniques for forming one or more integrated circuit packages may be reduced or eliminated.

In certain embodiments, a leadframe structure for forming one or more integrated circuit packages includes a number of adjacent substantially parallel lead bars adapted to receive a die associated with an integrated circuit at one or more of the lead bars such that the one or more lead bars extend from opposite sides of the die. The leadframe structure also includes one or more support structures (e.g. lead support bars 26) adapted to help hold the lead bars together.

In certain embodiments, a method for forming one or more integrated circuit packages includes attaching a die associated with an integrated circuit chip to a die attach area coupled to one or more of a number of adjacent substantially parallel lead bars, each of the number of lead bars extending from both sides of the die attach area. The method also includes providing one or more conductive connectors. A first end portion of each conductive connector is attached to the die and a second end portion of each conductive connector is attached to a corresponding one of the lead bars at an attachment point. At least one of the lead bars has at least two conductive connectors attached to it and has attachment points on opposite sides of the die. The method also includes forming a package mold that substantially surrounds the die, at least a portion of the lead bars, and the one or more conductive connectors. The method further includes cutting at least one of the lead bars to which two conductive connectors are attached such that each of the conductive connectors attached to the cut lead bar are not electrically coupled via the lead bar.

Particular embodiments of the present invention may provide one or more technical advantages. In certain embodiments, the present invention provides a flexible leadframe structure and package assembly process in that integrated circuit packages having different numbers of pins (i.e., also referred to as leads or lead fingers) may be formed using the same or multiple instances of the same leadframe structure. This may reduce or eliminate the need to design, construct, and build different types of leadframe structures for certain different types of integrated circuit packages. In certain embodiments, the flexible leadframe structure and associated package assembly process may be used substantially without regard to the number of pins per integrated circuit package and die size of the integrated circuit package.

Certain embodiments may reduce the number of leadframe parts used in leadframe structures and integrated circuit packages relative to previous leadframe structure design techniques. In particular embodiments, the number of leadframe parts may be based on lead pitch type rather than being based on the number of pins per package and/or the size of the die of an integrated circuit package, possibly reducing the number of leadframe parts. In certain embodiments, by reducing the need to design, construct, and build different leadframe structures for different integrated circuit types, the cost and effort of designing and building different leadframe tools for each of these different leadframe structures may be reduce or eliminated. Furthermore, in particular embodiments, the need for different documentation for each of these leadframe structures and leadframe tools may be reduced or eliminated.

Certain embodiments of the present invention may provide some, all, or none of the above technical advantages. Certain embodiments may provide one or more other technical advantages, one or more of which may be readily apparent to those skilled in the art from the figures, descriptions, and claims included herein.

BRIEF DESCRIPTION OF THE DRAWINGS

For a more complete understanding of the present invention and features and advantages thereof, reference is now made to the following description, taken in conjunction with the accompanying drawings, in which.

DESCRIPTION OF EXAMPLE EMBODIMENTS

Figure 1A:
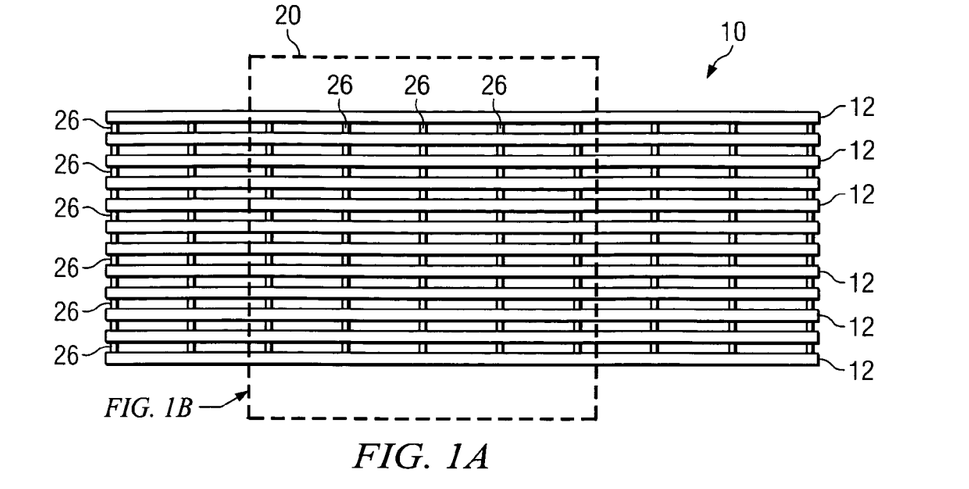
FIGS. 1A–1B illustrate example full and magnified views, respectively, of an example leadframe structure for forming one or more integrated circuit packages according to one embodiment of the present invention.
Figure 1B:
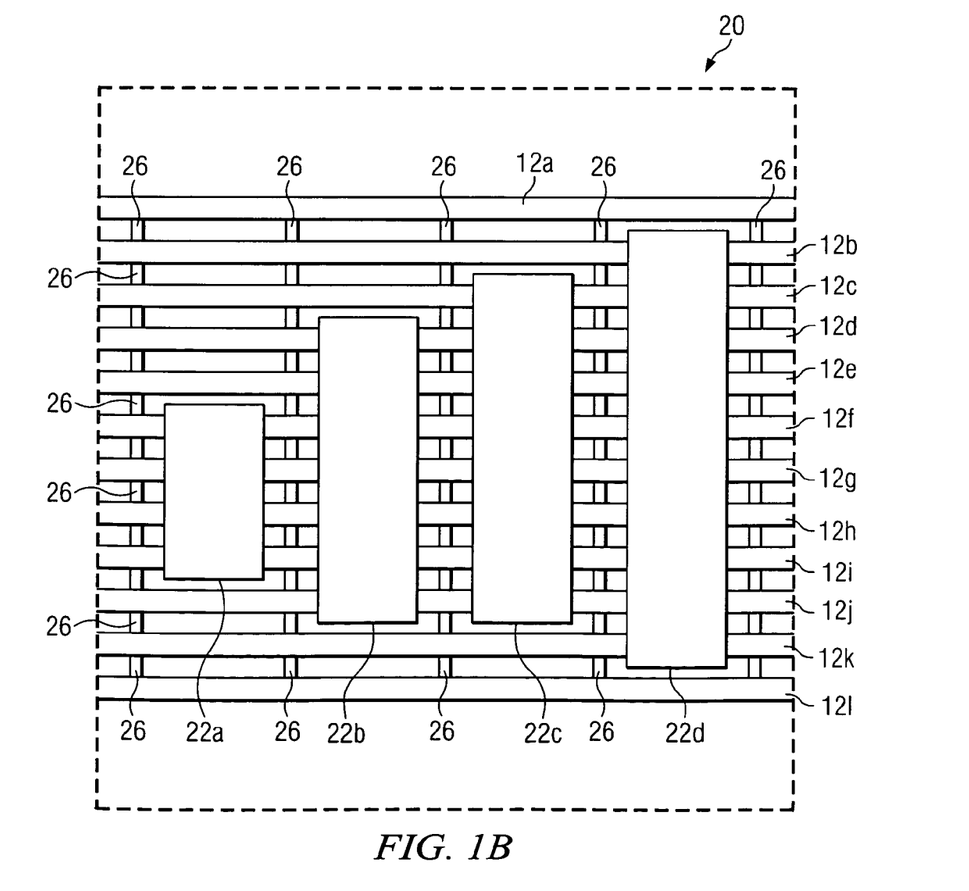

FIGS. 1A–1B illustrate example full and magnified views, respectively, of an example leadframe structure 10 for forming one or more integrated circuit packages according to one embodiment of the present invention. For example, the one or more integrated circuit packages may include two-way leaded packages such as small outline integrated circuits (SOICs), small outline packages (SOPs), small shrink outline packages (SSOPs), thin shrink small outline packages (TSSOPs), or any other suitable types of integrated circuit packages, according to particular needs. In certain embodiments, leadframe structure 10 is a leadframe sheet for forming a plurality of integrated circuit packages. In certain other embodiments, leadframe structure 10 is a single leadframe for forming a single integrated circuit package.

Leadframe structure 10 includes a plurality of adjacent and substantially parallel lead bars 12. Typically, lead bars 12 will form the "pins" or "leads" of the one or more integrated circuit packages formed using leadframe structure 10. Lead bars 12 may include any suitable pitch (i.e., the separation between adjacent lead bars 12) according to particular needs. The pitch between adjacent lead bars 12 may be uniform for all lead bars 12 of leadframe structure 10, the same for certain lead bars 12 of leadframe structure 10, or different for all lead bars 12 of leadframe structure 10, according to particular needs. The pitch between lead bars 12 determines the pitch between the pins or leads of the one or more integrated circuit packages formed using leadframe structure 10. Furthermore, the number of lead bars 12 of leadframe structure 10 may provide a cap on the number of pins an integrated circuit structure formed using leadframe structure 10 may have.

In certain embodiments, lead bars 12 include copper, a copper alloy, a ferrous alloy, or any other suitable metal or metal alloy; however, the present invention contemplates lead bars 12 including any suitable conductive material. In particular embodiments, lead bars 12 include a copper alloy that includes approximately ninety-eight percent copper. In certain embodiments, portions of leadframe structure 10 (e.g., a surface of lead bars 12) may be coated or plated in silver, palladium, or another suitable metal for enhancing electrically conductive connections within, to, or out of an integrated circuit package formed using leadframe structure 10. For example, this coating or plating may provide improved electrical connections to one or more conductive connectors (e.g., bond wires) connecting a die of the integrated circuit package to lead bars 12. In certain embodiments, the choice of material or materials used to make lead bars 12 or to coat lead bars 12 may affect the thermal dissipation capabilities of an integrated circuit package formed using leadframe structure 10.

As can be seen in the magnified view of a portion 20 of leadframe structure 10, in certain embodiments, one or more die attach areas 22 may each be coupled to one or more of lead bars 12. The lead bars 12 over which a die attach area 22 is attached extend from opposite sides of a die attach area 22 (e.g., lead bars 12f, 12g, 12h, and 12i extend from both sides of die attach area 22a). For example, the lead bars 12 over which die attach area 22 is attached may continue underneath die attach area 22, extending from opposite sides of die attach area 22. In certain embodiments, die attach areas 22 may be referred to or may be similar to what is typically referred to as a die flag of a leadframe. Die attach areas 22 may also be referred to as die pads. Each die attach area 22 may include nickel, a nickel alloy (e.g., forty-two percent nickel and sixty-eight percent iron), or any other suitable metal, metal alloy, or other suitable conductive material. In certain embodiments, die attach area 22 and lead bars 12 include substantially the same material, although this is not required.

Each die attach area 22 may be used to form a separate integrated circuit package using leadframe structure 10. During integrated circuit packaging, a die associated with an integrated circuit chip may be attached to a corresponding die attach area 22 using a gold-silicon eutectic layer, an epoxy adhesive material, or any other appropriate technique for attaching a die to a corresponding die attach area 22. Although die attach areas 22 are illustrated as having particular sizes and shapes, the present invention contemplates die attach areas 22 having any suitable sizes and shapes, according to particular needs. In certain embodiments, each die attach area 22 attached to leadframe structure 10 is substantially the same size. In certain other embodiments, die attach areas 22 of varying sizes may be attached to leadframe structure 10.

In certain embodiments, the same leadframe structure 10 or another instance of the same leadframe structure 10 may be used to form integrated circuit packages of varying sizes. This may reduce or eliminate the need to design, construct, and build different leadframe structures for different types of integrated circuit packages (i.e., integrated circuit packages having different numbers of pins or having dies of differing sizes). For example, on one leadframe structure 10, one or more die attach areas 22 of a first size may be attached to leadframe structure 10. Suppose, for example, that integrated circuit packages having eight pins are desired. Die attach areas 22 covering at least four lead bars 12 may be attached to leadframe structure 10 (e.g., die attach area 22a). Suppose, as another example, that integrated circuit packages having fourteen pins are desired. Die attach areas 22 covering at least seven lead bars 12 may be attached to leadframe structure 10 (e.g., die attach area 22b). Suppose, as another example, that integrated circuit packages having sixteen pins are desired. Die attach areas 22 covering at least eight lead bars 12 may be attached to leadframe structure 10 (e.g., die attach area 22c). Suppose, as another example, that integrated circuit packages having twenty pins are desired. Die attach areas 22 covering at least ten lead bars 12 may be attached to leadframe structure 10 (e.g., die attach area 22d). Although particular examples of pin numbers are described, the present invention contemplates forming integrated circuit packages having any suitable number of pins, according to particular needs.

As another example, die attach areas 22 of multiple sizes (e.g., two or more of die attach areas 22a, 22b, 22c, and 22d) may be attached to the same leadframe structure 10. Thus, in certain embodiments, it may not be necessary to design, construct, and build different leadframe structures for different types of integrated circuit packages (i.e., integrated circuit packages having different numbers of pins or having dies of differing sizes). Rather, in certain embodiments, different leadframe structures 10 may be formed according to a desired pitch of the pins of integrated circuit structures formed using leadframe structures 10 by forming leadframe structures 10 having lead bars 12 of the desired pitches. Although leadframe structure 10 is described primarily as including one or more die attach areas 22, the present invention contemplates mounting or otherwise attaching one or more dies associated with an integrated circuit directly to one or more of lead bars 12 without the use of die attach area 22. In certain embodiments, including die attach area 22 may increase the strength and durability of leadframe structure 10, possibly reducing warping of leadframe structure 10 for example. Furthermore, die attach areas 22 may facilitate heat dissipation within an integrated circuit package formed using leadframe structure 10.

In certain embodiments, leadframe structure 10 includes one or more lead support bars 26; however, as described in more detail below with reference to FIGS. 2A–2C, the present invention contemplates leadframe structure 10 not including lead support bars 26. Typically, lead support bars 26 include the same material as lead bars 12; however, the present invention contemplates lead support bars 26 including any suitable material, according to particular needs. Furthermore, although a particular number of lead support bars 26 are illustrated, the present invention contemplates leadframe structure 10 including any suitable number of lead support bars 26. Lead support bars 26 may be substantially perpendicular to lead bars 12 of leadframe structure 10. In certain embodiments, lead support bars 26 may help hold together lead bars 12 of leadframe structure 10. For example, in embodiments in which no die attach area 22 is attached to lead bars 12, lead support bars 26 may be particularly important to help hold together lead bars 12 of leadframe structure 10. Lead support bars 26 may be referred to as support structures of leadframe structure 10. Lead support bars 26 may facilitate dissipation of heat within and/or from an integrated circuit package formed using leadframe structure 10.

In certain embodiments, die attach areas 22 may each be attached to leadframe structure 10 between adjacent lead support bars 26. In certain other embodiments, die attach areas 22 may each be attached over a corresponding lead support bar 26. In such embodiments, each lead support bar 26 may help support the corresponding integrated circuit package (e.g., the die of the corresponding integrated circuit package) formed using the die attach area 22 corresponding to the lead support bar 26.

Particular embodiments of the present invention may provide one or more technical advantages. In certain embodiments, the present invention provides a flexible leadframe structure 10 and package assembly process in that integrated circuit packages having different numbers of pins (i.e., also referred to as leads or lead fingers) may be formed using the same or multiple instances of the same leadframe structure 10. This may reduce or eliminate the need to design, construct, and build different types of leadframe structures for certain different types of integrated circuit packages. In certain embodiments, flexible leadframe structure 10 and the associated package assembly process may be used substantially without regard to the number of pins per integrated circuit package and die size of the integrated circuit package.

Certain embodiments may reduce the number of leadframe parts used in leadframe structures and integrated circuit packages relative to previous leadframe structure design techniques. In particular embodiments, the number of leadframe parts may be based on lead pitch type rather than being based on the number of pins per package and/or the size of the die of an integrated circuit package, possibly reducing the number of leadframe parts. In certain embodiments, by reducing the need to design, construct, and build different leadframe structures for different integrated circuit types, the cost and effort of designing and building different leadframe tools for each of these different leadframe structures may be reduce or eliminated. Furthermore, in particular embodiments, the need for different documentation for each of these leadframe structures and leadframe tools may be reduced or eliminated.

Figure 2A:
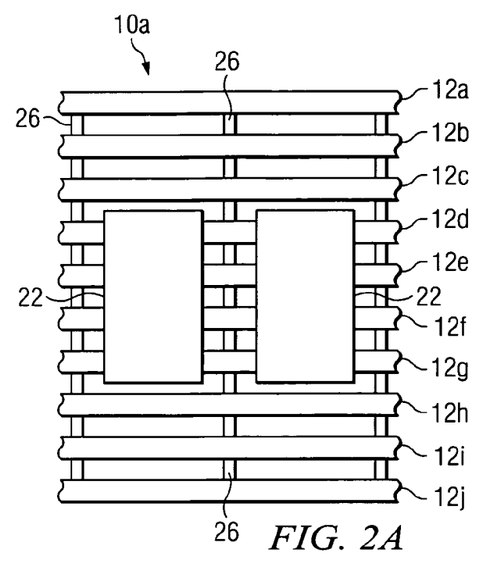
FIGS. 2A–2C illustrate three example embodiments of a leadframe structure for forming one or more integrated circuit packages according to the present invention.
Figure 2B:
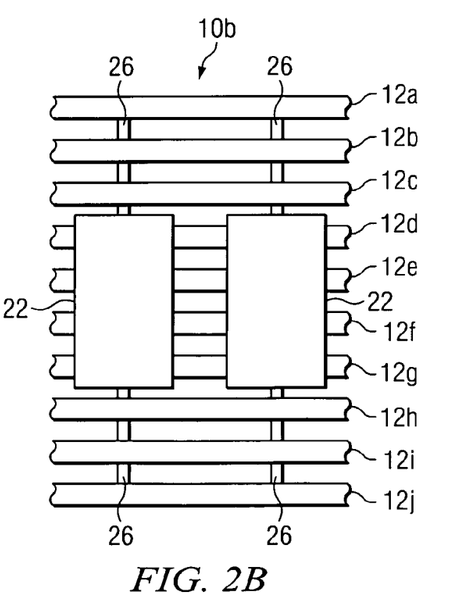
Figure 2C:
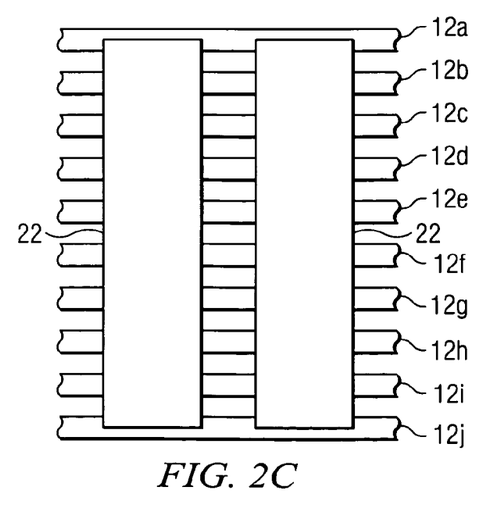

FIGS. 2A–2C illustrate three example embodiments of leadframe structure 10 for forming one or more integrated circuit packages according to the present invention. For each of these example embodiments of leadframe structure 10, although a particular number of lead bars 12 are illustrated, the present invention contemplates leadframe structure 10 including any suitable number of lead bars 12, according to particular needs.

As shown in FIG. 2A, leadframe structure 10a includes a plurality of substantially parallel lead bars 12, a plurality of lead support bars 26, and one or more die attach areas 22 each attached to leadframe structure 10a between adjacent lead support bars 26. Although the plurality of lead support bars 26 are illustrated as being perpendicular to lead bars 12, the present invention contemplates lead support bars 26 being at any suitable angle relative to lead bars 12, according to particular needs. Furthermore, although die attach areas 22 are illustrated as having a particular size and shape, the present invention contemplates die attach areas having any suitable size and shape, according to particular needs. In certain embodiments, leadframe structure 10a may be conducive to formation of integrated circuit packages that include a relatively small die attach area 22 (e.g., integrated circuit packages in which the die of the integrated circuit package is mounted as an S-pad). However, the present invention contemplates formation of any suitable integrated circuit package having any suitable die attach area 22 according to particular needs.

As shown in FIG. 2B, leadframe structure 10b includes a plurality of substantially parallel lead bars 12, a plurality of lead support bars 26, and one or more die attach areas 22 each attached over a corresponding lead support bar 26. Although the plurality of lead support bars 26 are illustrated as being perpendicular to lead bars 12, the present invention contemplates lead support bars 26 being at any suitable angle relative to lead bars 12, according to particular needs. Additionally, although die attach areas 22 are illustrated as having a particular size and shape, the present invention contemplates die attach areas 22 having any suitable size and shape, according to particular needs. Furthermore, although die attach areas 22 are shown as being substantially centered over corresponding lead support bars 26, the present invention is not intended to be so limited. In certain embodiments, leadframe structure 10b may be conducive to formation of integrated circuit packages that include a relatively small die attach area 22 (e.g., integrated circuit packages in which the die of the integrated circuit package is mounted as an S-pad). However, the present invention contemplates formation of any suitable integrated circuit package having any suitable die attach area 22 according to particular needs.

As shown in FIG. 2C, leadframe structure 10c includes a plurality of substantially parallel lead bars 12 and one or more die attach areas 22, one or more of die attach areas 22 extending from a first exterior lead bar 12a to a second exterior lead bar 12j, helping to hold lead bars 12 of leadframe structure 10c together. In such embodiments, die attach areas 22 may be referred to as a support structure of leadframe structure 10. Although die attach areas 22 are illustrated as having a particular shape, the present invention contemplates die attach areas 22 having any suitable shape, according to particular needs. In certain embodiments, leadframe structure 10c does not include any lead support bars 26 or includes a reduced number of lead support bars 26. For example, because the die attach areas 22 extending from first exterior lead bar 12a to second exterior lead bar 12j help hold leadframe structure 10c together, inclusion of lead support bars 26 may be unnecessary. However, the present invention contemplates leadframe structure 10c including any suitable number of lead support bars 26, according to particular needs.

In certain embodiments, the larger die attach area 22 of leadframe structure 10c may provide improved thermal dissipation for an integrated circuit package formed using leadframe structure 10c. This improved heat dissipation characteristic of certain embodiments of leadframe structure 10c may make leadframe structure 10c conducive for use in forming powerpad integrated circuit packages, for example; however, the present invention contemplates using leadframe structure 10c for forming any suitable type of integrated circuit package, according to particular needs.

Although FIGS. 2A–2C have been described as separate embodiments of leadframe structure 10, the present invention contemplates combining these various embodiments in the same leadframe structure 10. As just one example, on a single leadframe structure 10 that includes a plurality of lead support bars 26, in a first area of the leadframe structure 10, one or more die attach areas 22 may be attached over a corresponding lead support bars, while in a second area of the leadframe structure 10, one or more die attach areas 22 may be attached between adjacent lead support bars 26.

Figure 3:
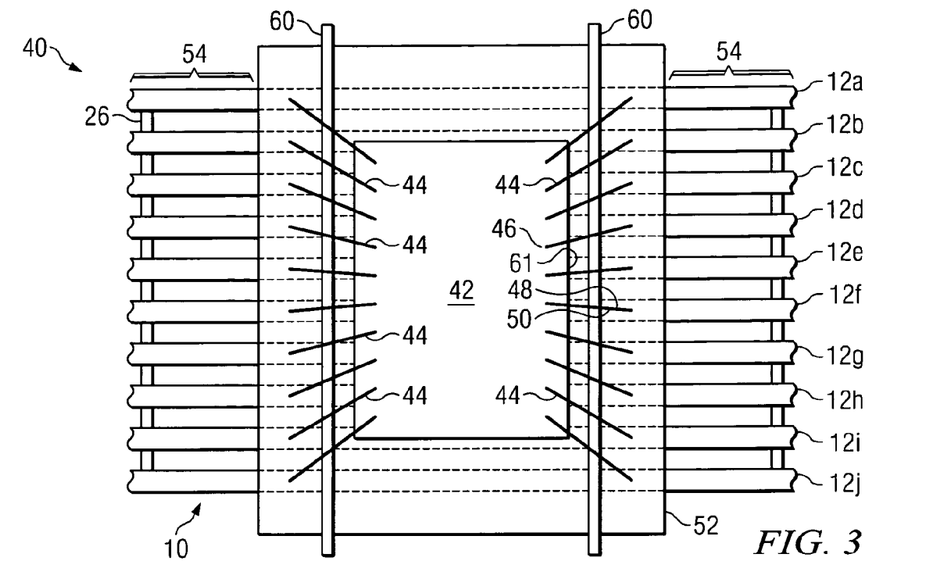
FIG. 3 illustrates a top view of an example integrated circuit package, which is in the process of being formed according to example embodiments of the present invention.

FIG. 3 illustrates a top view of an example integrated circuit package 40, which is in the process of being formed according to example embodiments of the present invention. For example, integrated circuit package 40 may be in a state prior to a cutting process for cutting one or more lead bars 12, as described in more detail below with reference to FIGS. 4A–4D. Integrated circuit package 40 includes leadframe structure 10. In certain embodiments, leadframe structure 10 may still be a part of a sheet with multiple integrated circuit packages 40 being formed substantially simultaneously on the sheet. In certain other embodiments, leadframe structure 10 has already been separated in a suitable manner from a sheet. Integrated circuit package 40 includes a die 42. In certain embodiments, die is attached to a die attach area (e.g., die attach area 22) on one or more lead bars 12, the die attach area 22 being between die 42 and the one or more lead bars 12 to which die 42 is attached. In other embodiments, die 42 is attached directly to one or more lead bars 12. Die 42 may be any suitable size (i.e., greater than, equal to, or less than the size of die attach area 22), according to particular needs. Lead bars 12 of leadframe structure 10 extend from both sides of die 42.

Leadframe structure 10 includes one or more conductive connectors 44. In certain embodiments, conductive connectors 44 include gold or other bond wires, although the present invention contemplates conductive connectors 44 including any suitable component for providing an electrical connection between portions of integrated circuit package 40. A first end portion 46 of each conductive connector 44 is attached to die 42. For example, first end portions 46 of each conductive connector 44 may be attached to die 42 at one or more bond pads of die 42. A second end portion 48 of each conductive connector 44 is attached to a corresponding one of lead bars 12 at an attachment point 50. At least one of lead bars 12 includes at least two conductive connectors 44 attached thereto and having attachment points 50 on opposite sides of die 42. In the illustrated embodiment, each lead bar 12 includes two conductive connectors 44 attached thereto and having attachment points 50 on opposite sides of die 42.

Integrated circuit package 40 includes a package mold 52 substantially surrounding die 42, at least a portion of lead bars 12, and conductive connectors 44. In the illustrated embodiment, package mold 52 is shown as being transparent so that certain components of integrated circuit package 40 that are typically surrounded by package mold 52 can be seen for ease of description. Package mold 52 may be formed, molded, deposited or otherwise provided in any suitable manner, such as by injection molding or by dropping globs of a packaging material on die 42, connectors 44, and portions of lead bars 12. Package mold 52 may include any suitable material, according to particular needs. For example, package mold 52 may include an electrically insulating material, such as plastic, epoxy, glass, or wax, capable of being formed or molded into a desired shape. One or more of lead bars 12 include a portion 54 extending outside package mold 52. In the illustrated embodiment, each lead bar 12 includes two portions 54 extending from opposite sides of package mold 52.

It is generally desirable to cut at least each lead bar 12 that has two or more conductive connectors 44 attached thereto at attachment points 50 on opposite sides of die 42. For example, it may be problematic if portions of one of these lead bars 12 having two conductive connectors 44 on opposite sides of die 42 (or on the same side) are electrically coupled. This cutting of lead bars 12 typically occurs in locations 60 between attachment points 50 of conductive connectors 44 and edges 61 of die 42 on each side of die 42. In certain embodiments, all lead bars 12 of integrated circuit package 40 may be similarly cut, although this is not required. In certain embodiments, lead bars 12 are cut using a high-precision saw (e.g., a diamond saw) or other suitable saw 62; however, the present invention contemplates cutting lead bars 12 using any suitable tools and techniques, according to particular needs (e.g., using laser technology).

Figure 4A:
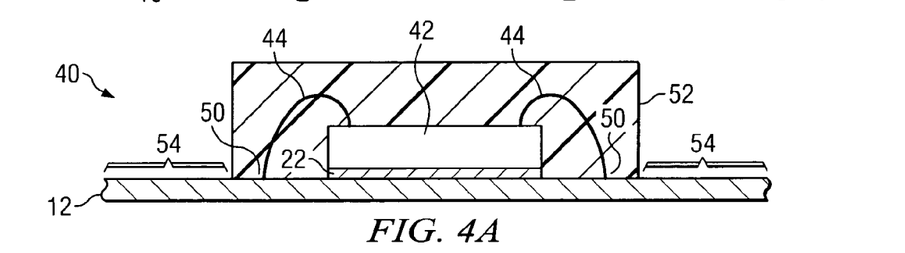
FIGS. 4A–4D illustrate an example process for forming one or more integrated circuit package using a leadframe structure according to example embodiments of the present invention.

FIGS. 4A–4D illustrate an example process for forming one or more integrated circuit package 40 using leadframe structure 10 according to example embodiments of the present invention. FIG. 4A illustrates a cross-sectional view of an example integrated circuit package 40, which is in the process of being formed using leadframe structure 10 according to example embodiments of the present invention. In the illustrated example, integrated circuit package 40 includes one or more lead bars 12, die 42, package mold 52, and one or more conductive connectors 44. In certain embodiments, integrated circuit package 40 includes die attach area 22 positioned substantially between die 42 and lead bars 12. Each lead bar 12 of integrated circuit package 40 is continuous under die 42 and extends from opposite sides of die 42. One or more of lead bars 12 of integrated circuit package 40 each have at least two conductive connectors 44 attached thereto at attachment points 50 on opposite sides of die 42. Portions 54 of one or more lead bars 12 extend outside package mold 52.

Figure 4B:
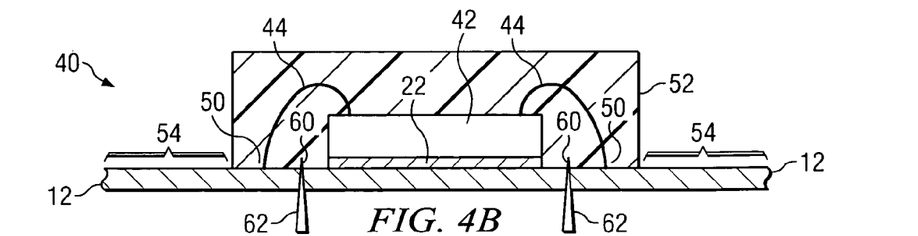

As shown in FIG. 4B, at least the lead bars 12 having two conductive connectors 44 attached thereto at attachment points 50 on opposite sides of die 42 may be cut at one or more locations 60. This is generally desirable because, as discussed above, it may be problematic if portions of one of these lead bars 12 on each sides of die 42 are electrically coupled. This cutting of lead bars 12 typically occurs at locations 60 between attachment points 50 of conductive connectors 44 and die 42 on opposite sides of die 42. In certain embodiments, all lead bars 12 of integrated circuit package 40 may be similarly cut, although this is not required. In certain embodiments, lead bars 12 are cut using a high-precision saw (e.g., a diamond saw) or other suitable saw 62; however, the present invention contemplates cutting lead bars 12 using any suitable tools and techniques, according to particular needs (e.g., using laser technology).

Figure 4C:
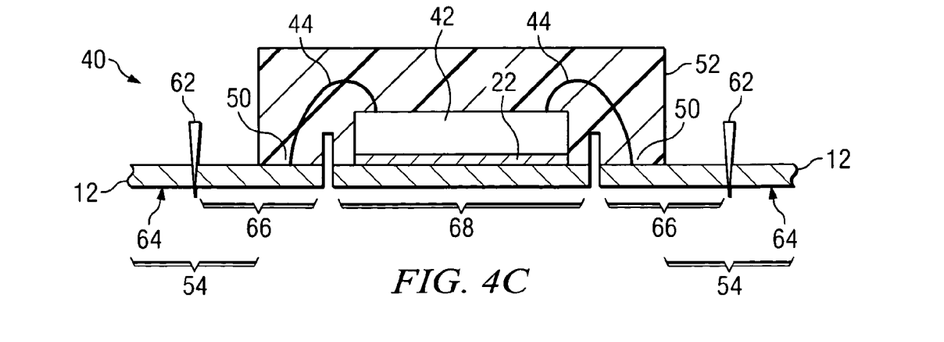

As shown in FIG. 4C, excess portions 64 of portions 54 of lead bars 12 extending from package mold 52 may be cut off from integrated circuit package 40 using a high-precision saw (e.g., a diamond saw) or other suitable saw 62; however, the present invention contemplates cutting excess portions 64 of lead bars 12 using any suitable tools and techniques, according to particular needs (e.g., using laser technology). Remaining portions 66 of lead bars 12 may form the outer leads of integrated circuit package 40, which may serve a variety of purposes such as electrically connecting integrated circuit package 40 to another suitable device or component (e.g., a printed circuit board). Portions 68 of lead bars 12 may form the inner leads of integrated circuit package 40, which may serve a variety of purposes such as facilitating heat dissipation within integrated circuit package 40.

Figure 4D:
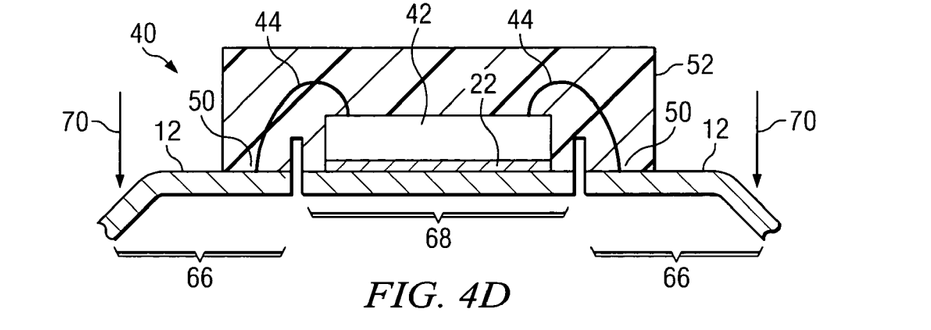

As shown in FIG. 4D, remaining portions 66 of lead bars 12 extending from package mold 52 may be bent or otherwise manipulated. For example, remaining portions 66 of lead bars 12 may be bent in a direction 70 to form the pins of integrated circuit package 40.

Figure 5:
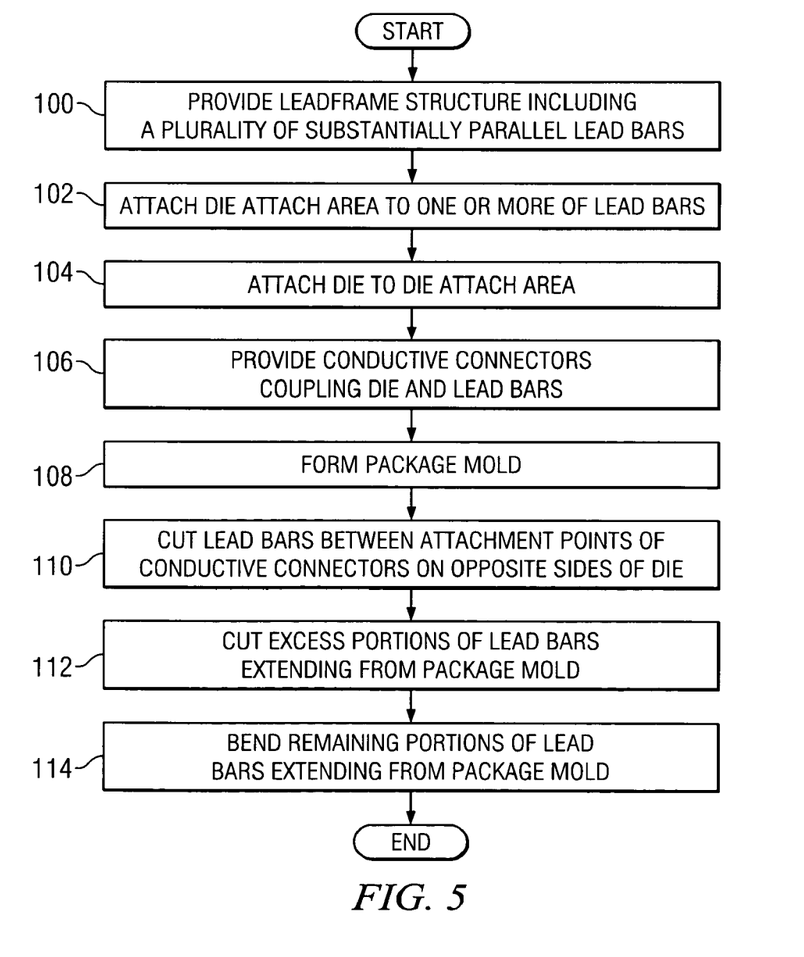
FIG. 5 illustrates an example method for forming an integrated circuit package using leadframe structure according to example embodiments of the present invention.

FIG. 5 illustrates an example method for forming an integrated circuit package 40 using leadframe structure 10 according to example embodiments of the present invention. As discussed above, integrated circuit package 40 may be formed alone or may be one of a plurality of integrated circuit packages 40 formed on a leadframe sheet. At step 100, a leadframe structure 10 is provided, which includes a plurality of substantially parallel lead bars 12. In certain embodiments, leadframe structure 10 includes one or more lead support bars 26. In such embodiments, leadframe structure 10 may be similar to leadframe structure 10a or 10b, for example.

At step 102, a die attach area 22 is attached to one or more of the plurality of lead bars 12. In certain embodiments, die attach area 22 extends from a first exterior lead bar to a second exterior lead bar. In such embodiments, leadframe structure 10 may be similar to leadframe structure 10c, for example. In certain other embodiments, die attach area 22 may be provided between adjacent lead support bars 26 (e.g., as illustrated by leadframe structure 10a) or provided over one or more corresponding lead support bars 26 (e.g., as illustrated by leadframe structure 10b). Although an embodiment of leadframe structure 10 is described in which die attach area 22 is attached to one or more of lead bars 12, the present invention contemplates not attaching die attach area 22 to lead bars 12 and mounting a die directly on lead bars 12.

At step 104, die 42 is attached to die attach area 22 using any suitable technique. Alternatively, die 42 may be attached directly to lead bars 12. At step 106, one or more conductive connectors 44 are coupled between die 42 and lead bars 12. A first end portion 46 of each conductive connector 44 is attached to die 42, and a second end portion 48 of each conductive connector 44 is attached to a corresponding one of lead bars 12 at an attachment point 50. In certain embodiments, at least one of lead bars 12 has at least two conductive connectors 44 attached thereto and having attachment points 50 on opposite sides of die 42. At step 108, package mold 52 is formed and substantially surrounds die 42, at least a portion of lead bars 12, and conductive connectors 44. At step 110, at least those lead bars 12 having two conductive connectors 44 attached thereto at attachment points 50 on opposite sides of die 42 are cut such that each of conductive connector 44 attached to the lead bar 12 are not electrically coupled via the lead bar 12. In certain embodiments, one or more of lead bars 12 may be cut on both sides of die 44 at a location 60 between attachment points 50 of conductive connectors 44 and die 42. Lead bars 12 may be cut using any suitable tools and techniques as described above with reference to FIGS. 3 and 4B.

At step 112, excess portions 64 of lead bars 12 extending from package mold 52 may be cut off from integrated circuit package 40 using any suitable tools and techniques as described above with reference to FIG. 4C. Remaining portions 66 of lead bars 12 may form the outer leads of integrated circuit package 40, which may serve a variety of purposes such as electrically connecting integrated circuit package 40 to another suitable device or component (e.g., a printed circuit board). Portions 68 of lead bars 12 may form the inner leads of integrated circuit package 40, which may serve a variety of purposes such as facilitating heat dissipation within integrated circuit package 40. At step 114, remaining portions 66 of lead bars 12 extending from package mold 52 may be bent or otherwise manipulated. For example, remaining portions 66 of lead bars 12 may be bent in a direction 70 to form the pins of integrated circuit package 40.

Although the present invention has been described with several embodiments, diverse changes, substitutions, variations, alterations, and modifications may be suggested to one skilled in the art, and it is intended that the invention encompass all such changes, substitutions, variations, alterations, and modifications as fall within the spirit and scope of the appended claims.

What is claimed is:

1. A method for forming one or more integrated circuit packages, comprising:
    coupling a die to one or more of a plurality of adjacent substantially parallel lead bars such that each of the plurality of lead bars extends from opposite sides of the die;
    providing one or more conductive connectors, a first end portion of each conductive connector being attached to the die and a second end portion of each conductive connector being attached to a corresponding one of the lead bars at an attachment point, at least one of the lead bars having two or more conductive connectors attached thereto at attachment points on opposite sides of the die;
    forming a package mold, the package mold substantially surrounding the die, at least a portion of the lead bars, and the one or more conductive connectors; and
    cutting the lead bars having two or more conductive connectors attached thereto such that the two or more conductive connectors attached to the cut lead bars are not electrically coupled via the lead bar, comprising cutting at a first location between a first edge of the die and the attachment point of a first one of the conductive connectors attached to the lead bar.

2. The method of claim 1, wherein:
    one or more of the lead bars each comprise a portion extending outside the package mold; and
    the method further comprises, cutting the portion extending outside the package mold such that a remaining portion extending outside the package mold forms a lead finger of the integrated circuit package.

3. The method of claim 1, further comprising coupling a die attach pad to one or more of the plurality of lead bars, the die being coupled to the die attach pad such that the die attach pad is substantially between the die and one or more of the lead bars.

4. The method of claim 3, further comprising coupling one or more lead support bars substantially perpendicular to the plurality of lead bars.

5. The method of claim 4, comprising coupling the die attach area to one or more of the lead support bars.

6. The method of claim 4, comprising:
providing at least two of the adjacent substantially parallel lead support bars; and
coupling the die attach area to one or more of the lead bars between two of the lead support bars.

7. The method of claim 3, wherein the die attach area coupled to the lead bars extends from a first exterior lead bar to a second exterior lead bar.

8. The method of claim 1, further comprising cutting the lead bar at a second location between a second edge of the die and the attachment point of a second one of the conductive connectors attached to the lead bar, the second edge of the die and the second conductive connector being on an opposite side of the die from the first edge of the die and the first conductive connector.

* * * * *